(12) United States Patent
Kubota

(10) Patent No.: US 12,080,577 B2
(45) Date of Patent: Sep. 3, 2024

(54) SUBSTRATE STORAGE CONTAINER

(71) Applicant: MIRAIAL CO., LTD., Tokyo (JP)

(72) Inventor: Kouji Kubota, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 0 days.

(21) Appl. No.: 17/925,695

(22) PCT Filed: May 19, 2020

(86) PCT No.: PCT/JP2020/019739
§ 371 (c)(1),
(2) Date: Nov. 16, 2022

(87) PCT Pub. No.: WO2021/234808
PCT Pub. Date: Nov. 25, 2021

(65) Prior Publication Data
US 2023/0197488 A1   Jun. 22, 2023

(51) Int. Cl.
*H01L 21/673* (2006.01)
(52) U.S. Cl.
CPC .. *H01L 21/67383* (2013.01); *H01L 21/67369* (2013.01); *H01L 21/67386* (2013.01)
(58) Field of Classification Search
CPC ......... H01L 21/67369; H01L 21/67386; H01L 21/67383; H01L 21/67376
(Continued)

(56) References Cited

U.S. PATENT DOCUMENTS

| 6,951,284 | B2 * | 10/2005 | Cheesman | ........ | H01L 21/67369 |
| | | | | | 211/41.18 |
| 7,344,031 | B2 * | 3/2008 | Hasegawa | ......... | H01L 21/67369 |
| | | | | | 257/E21.001 |

(Continued)

FOREIGN PATENT DOCUMENTS

| JP | 4412235 B2 | 2/2010 |
| JP | 4903893 B2 | 3/2012 |

(Continued)

*Primary Examiner* — Chun Hoi Cheung
(74) *Attorney, Agent, or Firm* — MUNCY, GEISSLER, OLDS & LOWE, P.C.

(57) ABSTRACT

This substrate storage container comprises: a lid body-side substrate support part which is capable of supporting an edge part of a substrate when the substrate storage container is closed; a depth-side substrate support part which is disposed so as to form a pair with the lid body-side substrate support part and is capable of supporting the edge part of the substrate; and a substrate edge part auxiliary part which is disposed at a portion opposing a substrate storage space when the substrate storage container is closed, and in which are formed a plurality of auxiliary grooves having an opening that is wider than the thickness of the edge part of the substrate so that the edge part of the substrate can be inserted therein. The auxiliary grooves each have opposing groove forming surfaces, and an edge part of one of a plurality of the substrates is inserted into each auxiliary groove when the container is closed. The edge part of the substrate is inserted into the auxiliary groove in a non-contact state in which a space is formed between the edge part of the substrate and the groove forming surfaces and the edge part of the substrate is not contacting the groove forming surfaces when the container is closed.

5 Claims, 14 Drawing Sheets

(58) Field of Classification Search
USPC .......................................... 206/701–711, 832
See application file for complete search history.

(56) References Cited

U.S. PATENT DOCUMENTS

| | | | | |
|---|---|---|---|---|
| 7,523,830 | B2* | 4/2009 | Burns | H01L 21/67369 |
| | | | | 206/711 |
| 7,967,146 | B2* | 6/2011 | Chen | G11B 33/0444 |
| | | | | 206/711 |
| 8,118,169 | B2* | 2/2012 | Hosoi | H01L 21/67369 |
| | | | | 206/711 |
| 8,528,738 | B2* | 9/2013 | Wiseman | H01L 21/67369 |
| | | | | 206/711 |
| 11,587,810 | B2* | 2/2023 | Harr | H01L 21/67369 |
| 2003/0221985 | A1* | 12/2003 | Yajima | H01L 21/67369 |
| | | | | 206/711 |
| 2010/0025287 | A1* | 2/2010 | Lin | H01L 21/67369 |
| | | | | 206/711 |
| 2011/0297579 | A1* | 12/2011 | Lu | H01L 21/67383 |
| | | | | 206/711 |
| 2013/0056389 | A1* | 3/2013 | Gregerson | H01L 21/67383 |
| | | | | 53/473 |
| 2014/0197068 | A1* | 7/2014 | Cho | H01L 21/67383 |
| | | | | 206/711 |
| 2015/0279711 | A1 | 10/2015 | Matsutori et al. | |
| 2015/0294882 | A1 | 10/2015 | Matsutori et al. | |
| 2017/0025294 | A1 | 1/2017 | Ozawa et al. | |
| 2018/0182655 | A1 | 6/2018 | Yokoyama et al. | |

FOREIGN PATENT DOCUMENTS

| | | |
|---|---|---|
| JP | 5483351 B2 | 5/2014 |
| WO | WO 2014/057572 A1 | 4/2014 |
| WO | WO 2014/080454 A1 | 5/2014 |
| WO | WO 2015/145629 A1 | 10/2015 |
| WO | WO 2017/006406 A1 | 1/2017 |

* cited by examiner

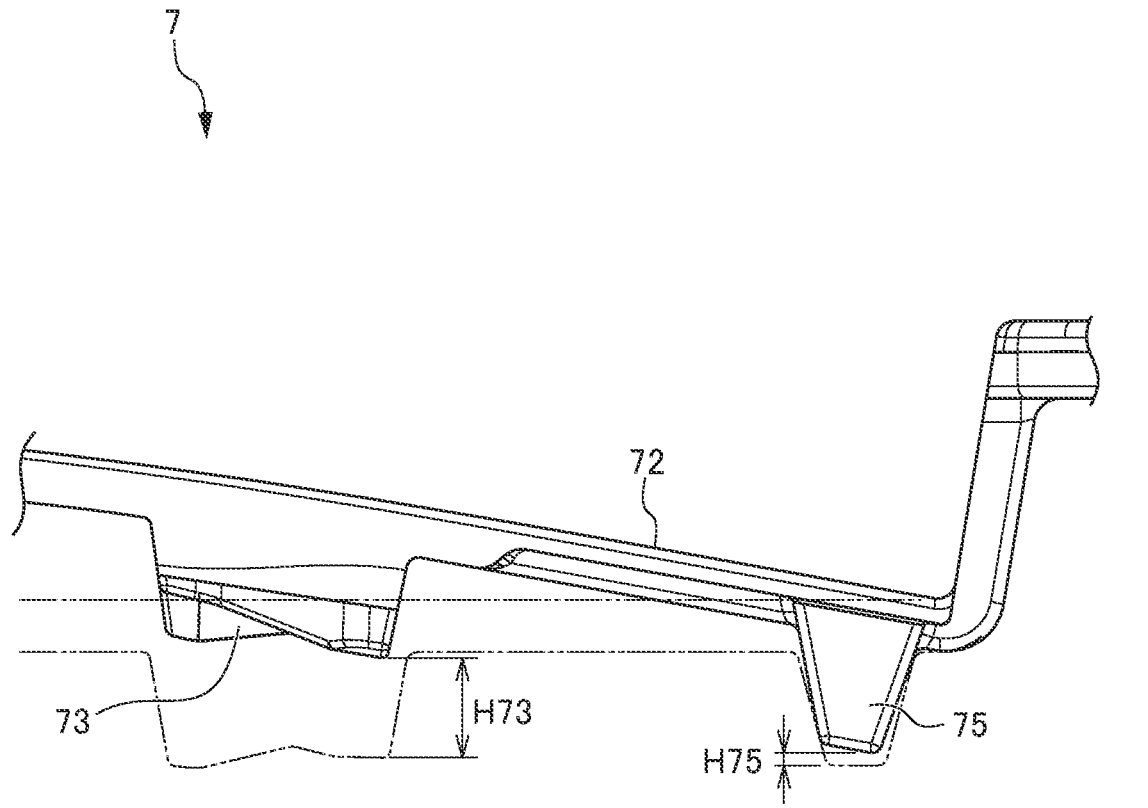
FIG. 11
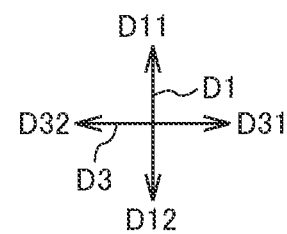

SUBSTRATE STORAGE CONTAINER

TECHNICAL FIELD

The present invention relates to a substrate storing container for use in storing, keeping, conveying, transporting, and the like substrates composed of semiconductor wafers or the like.

BACKGROUND ART

As a substrate storing container for storing and conveying substrates composed of semiconductor wafers, a substrate storing container that includes a container main body and a lid body has been known conventionally.

The container main body includes a tubular wall portion in which a container main body opening portion is formed at one end portion, and in which the other end portion is closed. A substrate storing space is formed in the container main body. The substrate storing space is formed by being surrounded by the wall portion and can store a plurality of substrates. The lid body can be removably attached to the container main body opening portion and can close the container main body opening portion.

A front retainer is provided at a part of the lid body that faces a substrate storing space when the container main body opening portion is closed. The front retainer can support edge portions of the plurality of substrates when the container main body opening portion is closed by the lid body. A rear retainer is provided at the wall portion so as to form a pair with the front retainer. The rear retainer can support edge portions of the plurality of substrates. The rear retainer supports the plurality of substrates in cooperation with the front retainer when the container main body opening portion is closed by the lid body, thereby retaining the plurality of substrates in a state in which the adjacent substrates are arranged in parallel to be spaced apart by a predetermined interval.

The front retainer has a plurality of grooves recessed in a direction away from the substrate storing space (for example, see Patent Documents 1, 2, and 3). In the conventional substrate storing container disclosed in the above documents, when the container main body opening portion is closed by the lid body and the substrates stored in the substrate storing space are conveyed, end portions of the substrates are always in contact with the front retainer. Therefore, the substrates tend to be damaged in the front retainer when the substrate storing container receives an impact during the conveyance of the substrates with the substrate storing container.

Patent Document 1: Japanese Patent No. 4903893
Patent Document 2: Japanese Patent No. 4412235
Patent Document 3: Japanese Patent No. 5483351

DISCLOSURE OF THE INVENTION

Problems to be Solved by the Invention

In recent years, further protection of the substrates against the impact acting on the substrate storing container has been required. Further, there is also a high demand for suppressing the occurrence of so-called cross slot, in which the substrate supported at a predetermined position of the front retainer is removed from the predetermined position and moved and inserted into a position adjacent to the predetermined position by the impact acting on the substrate storing container.

An object of the present invention is to provide a substrate storing container capable of protecting a substrate against an impact acting on a substrate storing container in a front retainer and capable of suppressing the occurrence of cross slot.

Means for Solving the Problems

The present invention relates to a substrate storing container including a container main body, a lid body, a lid body side substrate support portion, a back side substrate support portion, and a substrate edge portion auxiliary portion. The container main body includes a tubular wall portion having a container main body opening portion formed at one end portion and the other end portion being closed, and a substrate storing space formed by an inner face of the tubular wall portion and capable of storing a plurality of substrates and communicating with the container main body opening portion. The lid body is removably attached to the container main body opening portion and capable of closing the container main body opening portion. The lid body side substrate support portion is disposed on a part of the lid body that faces the substrate storing space and capable of supporting edge portions of the plurality of substrates when the container main body opening portion is closed by the lid body. The back side substrate support portion is disposed so as to form a pair with the lid body side substrate support portion in the substrate storing space, is capable of supporting edge portions of the plurality of substrates, and supports the plurality of substrates with the edge portions of the plurality of substrates arranged in parallel in cooperation with the lid body side substrate support portion when the container main body opening portion is closed by the lid body. The substrate edge portion auxiliary portion is disposed on a part of the lid body that faces the substrate storing space when the container main body opening portion is closed by the lid body. The substrate edge portion auxiliary portion includes a plurality of auxiliary grooves each having an opening greater than a thickness of an edge portion of each of the plurality of substrates so that the edge portion of each of the plurality of substrates can be inserted. The plurality of auxiliary grooves each have opposed groove forming faces. When the container main body opening portion is closed by at least the lid body, the edge portions of the plurality of substrates are respectively inserted into the auxiliary grooves. The auxiliary grooves are disposed further outward or further inward in a circumferential direction of the edge portions of the plurality of substrates than the lid body side substrate support portion with respect to a central axis of the tubular wall portion. The edge portions of the plurality of substrates are respectively inserted into the auxiliary grooves in a non-contact state in which a space is formed between each of the edge portions of the plurality of substrates and a corresponding groove forming face, and each of the edge portions of the plurality of substrates is not in contact with the corresponding groove forming face when the container main body opening portion is closed by the lid body.

Preferably, the lid body side substrate support portion and the substrate edge portion auxiliary portion that correspond to the same substrate are connected to each other.

It is preferable that the groove forming faces are substantially straight, flat planes, and that an angle formed between a front side or a back side of each of the plurality of substrates and the corresponding groove forming face is 30 degrees or less.

Preferably, there is provided side substrate support portions disposed to form a pair in the substrate storing space. Preferably, the side substrate support portions can support edge portions of the plurality of substrates in a state in which adjacent substrates among the plurality of substrates are arranged in parallel to be spaced apart from each other by a predetermined interval when the container main body opening portion is not closed by the lid body. Preferably, the auxiliary grooves each have a depth such that, when the container main body opening portion is not closed by the lid body and the edge portions of the plurality of substrates are supported by the side substrate support portions, the edge portions of the plurality of substrates are not inserted into the auxiliary grooves; and when the container main body opening portion is closed by the lid body, the edge portions of the substrates are inserted into the auxiliary grooves.

Preferably, the lid body side substrate support portion is elastically displaceable by a first displacement amount in a direction from the other end portion to the one end portion of the container main body when the container main body opening portion is closed by the lid body. Preferably, the substrate edge portion auxiliary portion is elastically displaceable by a second displacement amount smaller than the first displacement amount in the direction from the other end portion to the one end portion of the container main body when the container main body opening portion is closed by the lid body.

Effects of the Invention

According to the present invention, it is possible to provide a substrate storing container capable of protecting a substrate held in a front retainer against an impact acting on the substrate storing container and capable of suppressing the occurrence of cross slot.

BRIEF DESCRIPTION OF THE DRAWINGS

FIG. 11 is a partially enlarged view showing the amount by which each of a lid body side substrate support portion and a substrate edge portion auxiliary portion is displaced between the lid open state and the lid closed state;

PREFERRED MODE FOR CARRYING OUT THE INVENTION

Embodiment

Figure 1:
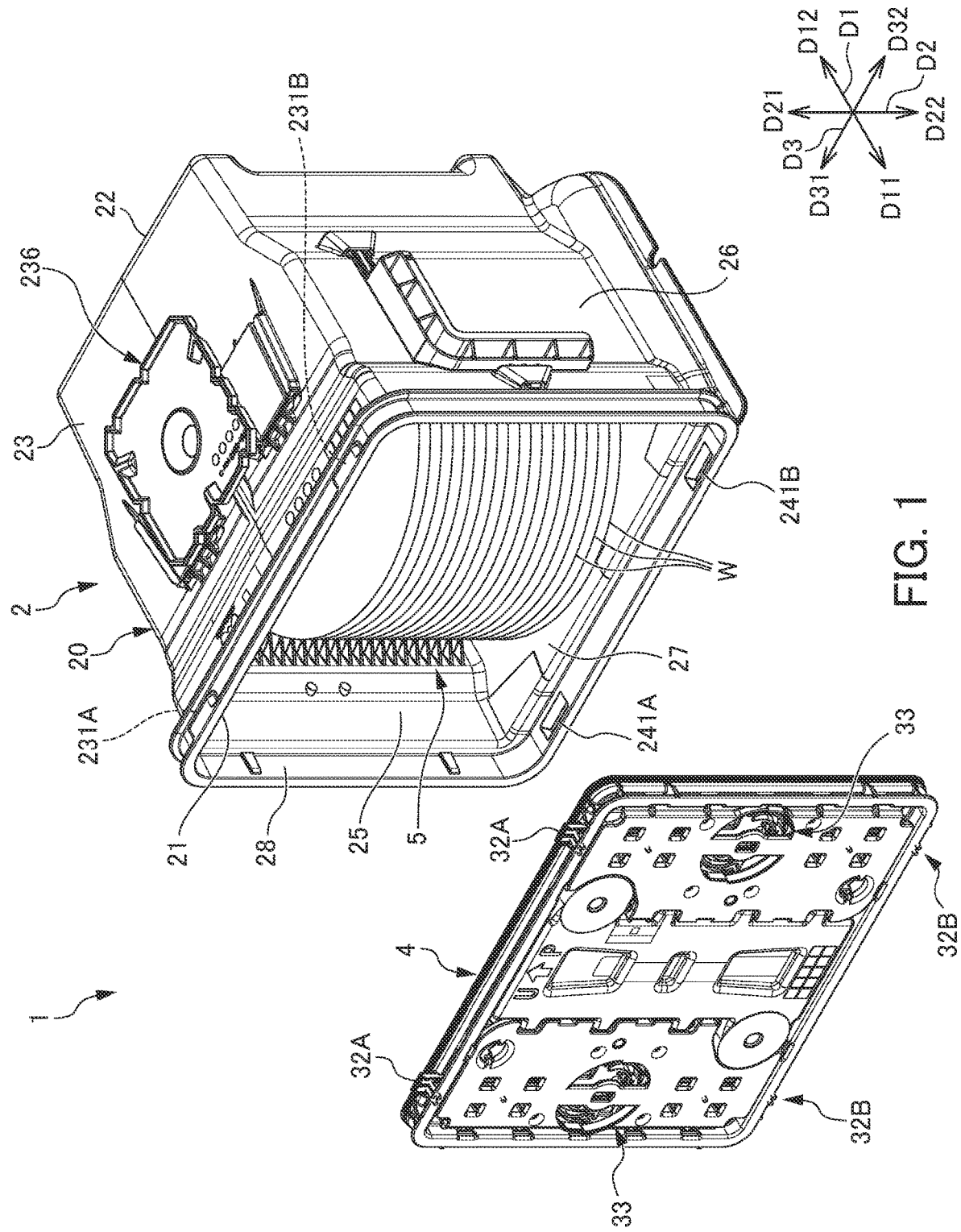
FIG. 1 is an exploded perspective view showing a state in which a plurality of substrates W are stored in a substrate storing container 1 according to a first embodiment of the present invention.
Figure 2:
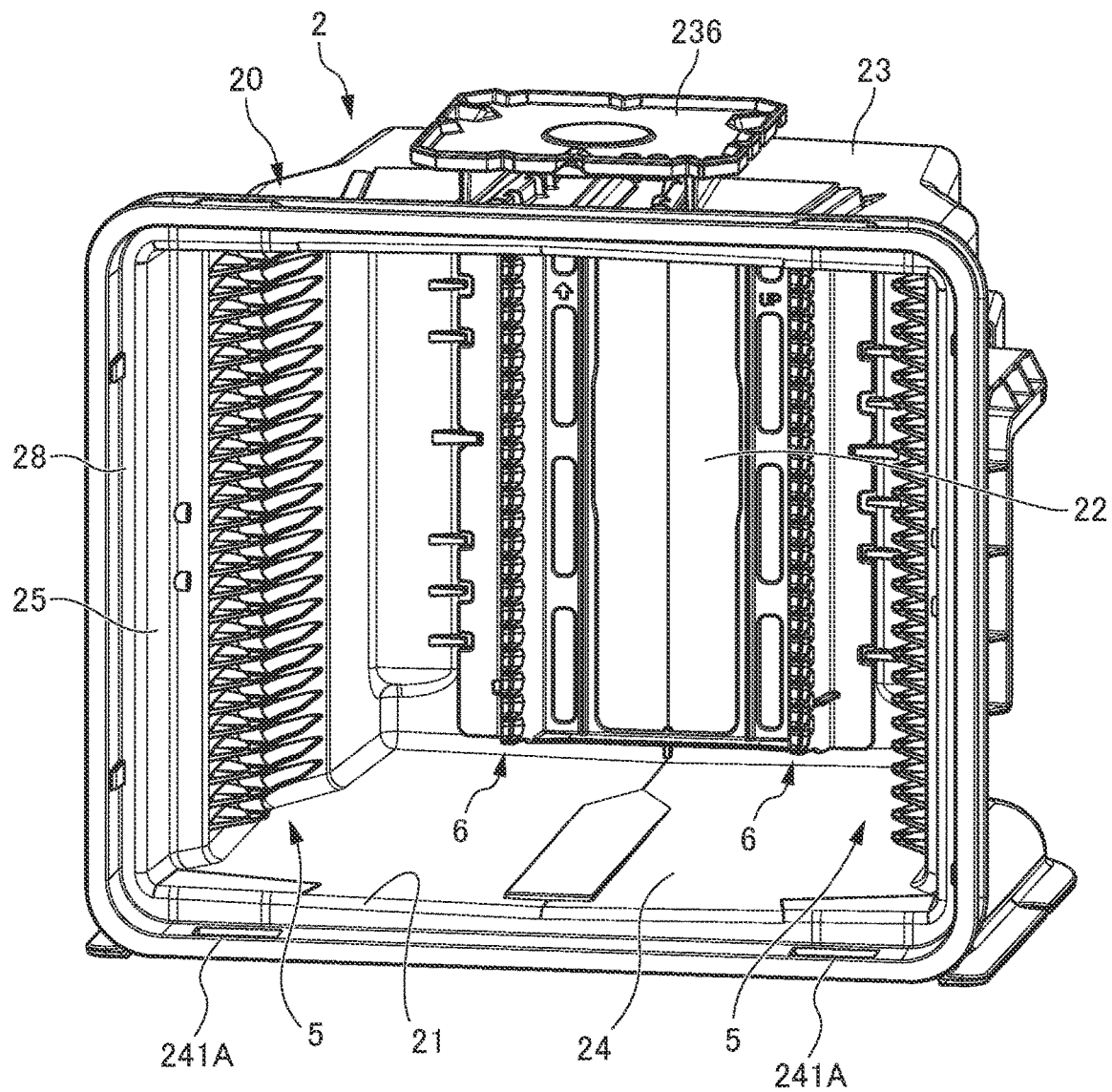
FIG. 2 is a perspective view of a container main body 2 of the substrate storing container 1 according to the first embodiment of the present invention.
Figure 2:
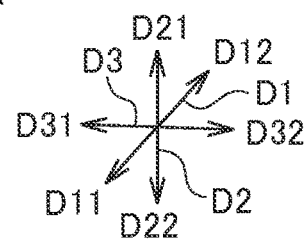

Hereinafter, a substrate storing container 1 according to a first embodiment will be described with reference to the drawings. FIG. 1 is an exploded perspective view showing a state in which a plurality of substrates W are stored in the substrate storing container 1 according to the first embodiment of the present invention. FIG. 2 is a perspective view of a container main body 2 of the substrate storing container 1 according to the first embodiment of the present invention.

For the purpose of explanation, a direction (direction from upper right toward lower left in FIG. 1) from the container main body 2 (to be described later) toward a lid body 3 (to be described later) is defined as a forward direction D11, and a direction opposite thereto is defined as a backward direction D12. The directions are collectively defined as a forward/backward direction D1. A direction (upper direction in FIG. 1) from a lower wall 24 (to be described later) toward an upper wall 23 (to be described later) is defined as an upper direction D21, and a direction opposite thereto is defined as a lower direction D22. The directions are collectively defined as an upper/lower direction D2. A direction (direction from lower right toward upper left in FIG. 1) from a second side wall 26 (to be described later) toward a first side wall 25 (to be described later) is defined as a left direction D31, and a direction opposite thereto is defined as a right direction D32. The directions are collectively defined as a left/right direction D3. Main drawings will be described with arrows indicating the directions.

The substrate W (see FIG. 1) stored in the substrate storing container 1 is a silicon wafer, a glass wafer, a sapphire wafer, or the like which has a disk shape, and is a thin wafer used in industrial applications. The substrate W in the present embodiment is a silicon wafer having a diameter of 300 mm.

As shown in FIGS. 1 and 2, the substrate storing container 1 is used as a shipping container for storing the substrates W composed of a silicon wafer as described above and transporting the substrates W by transport means such as land transport means, air transport means, or sea transport means. The substrate storing container 1 includes a container main body 2 and a lid body 3. The container main body 2 includes a substrate support plate-like portion 5 as a side substrate support portion and a back side substrate support portion 6 called a rear retainer. The lid body 3 includes a front retainer 7 (see FIGS. 3 to 6) having a lid body side substrate support portion 73 and a substrate edge portion auxiliary portion 75.

As shown in FIG. 1, etc., the container main body 2 includes a tubular wall portion 20 having a container main body opening portion 21 formed at one end portion and the other end portion being closed. A substrate storing space 27 is formed inside the container main body 2. The substrate storing space 27 is formed by being surrounded by the wall portion 20. As shown in FIG. 2, a substrate support plate-like portion 5 is disposed on a part of the wall portion 20 that forms the substrate storing space 27. As shown in FIG. 1, a plurality of the substrates W can be stored in the substrate storing space 27.

The substrate support plate-like portions 5 are provided on the wall portion 20 so as to form a pair in the substrate storing space 27. When the container main body opening portion 21 is not closed by the lid body 3 (when the lid is open), the substrate support plate-like portions 5 can support edge portions of the plurality of substrates W in a state in which the substrates W adjacent to each other are arranged in parallel to be spaced apart by a predetermined interval by being in contact with the edge portions of the plurality of substrates W. The back side substrate support portion 6 is provided on a back wall 22 (to be described later) of the wall portion 20 of the container main body 2.

The back side substrate support portions 6 (see FIG. 2, etc.) are provided on the wall portion 20 so as to form a pair with the front retainer 7 (see FIG. 8, etc.) described later in the substrate storing space 27. When the container main body opening portion 21 is closed by the lid body 3 (when the lid is closed), the back side substrate support portions 6 can support the rear portions of the edge portions of the plurality of substrates W.

The lid body 3 is removably attached to an opening circumferential portion 28 (FIG. 1, etc.) forming the container main body opening portion 21, and can close the container main body opening portion 21. The front retainer 7 is provided on a part of the lid body 3 that is opposite to the substrate storing space 27 when the container main body opening portion 21 is closed by the lid body 3. The front retainer 7 is disposed so as to form a pair with the back side substrate support portion 6 in the substrate storing space 27.

When the container main body opening portion 21 is closed by the lid body 3, the front retainer 7 can support the front portions of the edge portions of the plurality of substrates W by being in contact with the edge portions of the plurality of substrates W. When the container main body opening portion 21 is closed by the lid body 3, the front retainer 7 supports the plurality of substrates W in cooperation with the back side substrate support portions 6, thereby retaining the plurality of substrates W in a state in which the substrates W adjacent to each other are arranged in parallel to be spaced apart by a predetermined interval.

The substrate storing container 1 is made of a resin such as a plastic material, and examples of the resin include thermoplastic resins such as polycarbonate, cycloolefin polymer, polyetherimide, polyetherketone, polybutylene terephthalate, polyetheretherketone, and liquid crystal polymer, and alloys thereof. In the case of imparting conductivity to these resins which are molding materials, conductive materials such as carbon fibers, carbon powder, carbon nanotubes, and conductive polymers are selectively added. It is also possible to add glass fibers, carbon fibers, or the like to increase the rigidity.

Hereinafter, each portion will be described in detail. As shown in FIG. 1, the wall portion 20 of the container main body 2 includes the back wall 22, the upper wall 23, the lower wall 24, the first side wall 25, and the second side wall 26. The back wall 22, the upper wall 23, the lower wall 24, the first side wall 25, and the second side wall 26 are made of the above-described material, and are integrally molded.

The first side wall 25 is opposite to the second side wall 26, and the upper wall 23 is opposite to the lower wall 24. The rear edge of the upper wall 23, the rear edge of the lower wall 24, the rear edge of the first side wall 25, and the rear edge of the second side wall 26 are all connected to the back wall 22. The front edge of the upper wall 23, the front edge of the lower wall 24, the front edge of the first side wall 25, and the front edge of the second side wall 26 have a positional relationship opposite the back wall 22, and constitute the opening circumferential portion 28 that forms the container main body opening portion 21 in a substantially rectangular shape.

The opening circumferential portion 28 is provided at one end portion of the container main body 2, and the back wall 22 is positioned at the other end portion of the container main body 2. The outer shape of the container main body 2 formed by the outer faces of the wall portion 20 is a box shape. The inner faces of the wall portion 20, namely, the inner face of the back wall 22, the inner face of the upper wall 23, the inner face of the lower wall 24, the inner face of the first side wall 25, and the inner face of the second side wall 26 form the substrate storing space 27 surrounded thereby. The container main body opening portion 21 formed in the opening circumferential portion 28 communicates with the substrate storing space 27 that is surrounded by the wall portion 20 and is formed inside the container main body 2. A maximum of 25 substrates W can be stored in the substrate storing space 27.

As shown in FIG. 1, latch engagement recessed portions 231A, 231B, 241A, and 241B, which are recessed outwardly from the substrate storing space 27, are formed at parts of the upper wall 23 and the lower wall 24 that are proximal to the opening circumferential portion 28. A total of four latch engagement recessed portions 231A, 231B, 241A, and 241B are respectively formed near both right and left ends of the upper wall 23 and the lower wall 24.

As shown in FIG. 1, a top flange 236 is fixed to the central portion of the upper wall 23. The top flange 236 is a member corresponding to a part of the substrate storing container 1 from which it is hung to be suspended when the substrate storing container 1 is suspended by an automated material handling system (AMHS), a person guided vehicle (PGV), etc.

The substrate support plate-like portions 5 are formed integrally with the first side wall 25 and the second side wall 26, respectively, and are arranged so as to form a pair in the left/right direction D3. The substrate support plate-like portions 5 may be a separate body from the first side wall 25 and the second side wall 26.

The substrate support plate-like portion 5 has a plate-like substantially arc shape. A total of 50 substrate support plate-like portions 5 are provided, 25 on each of the first side wall 25 and the second side wall 26 in the upper/lower direction D2. Adjacent substrate support plate-like portions 5 are spaced apart from each other by intervals of 10 mm to 12 mm in the upper/lower direction D2 in parallel with each other. In addition, another plate-like member is arranged above the uppermost substrate support plate-like portion 5 in parallel with the substrate support plate-like portions 5. This member serves as a guide for inserting the uppermost substrate W into the substrate storing space 27.

The 25 substrate support plate-like portions 5 provided on the first side wall 25 and the 25 substrate support plate-like portions 5 provided on the second side wall 26 are opposed to each other in the left/right direction D3. The 50 substrate support plate-like portions 5 and the members serving as plate-like guides parallel to the substrate support plate-like portions 5 are parallel to the inner face of the lower wall 24. As shown in FIG. 2, etc., a projecting portion is provided on the upper face of the substrate support plate-like portion 5. The substrate W supported by the substrate support plate-like portion 5 contacts only the projecting end of the projecting portion, and is not in contact with the plane of the substrate support plate-like portion 5.

The substrate support plate-like portions 5 are capable of supporting edge portions of the plurality of substrates W in a state in which adjacent substrates W among the plurality of substrates W are spaced apart from each other at a predetermined interval and in parallel with each other.

The back side substrate support portion 6 is an internal component provided on the back wall 22 and disposed in the substrate storing space 27. The configuration of the back side substrate support portion 6 will be briefly described. The back side substrate support portion 6 has at least a lower inclined face and an upper inclined face.

The lower inclined face is constituted by an inclined face that inclines and extends away from the center of the substrate storing space 27 toward the upper direction D21. An end portion of the back side of the substrate W slides on the lower inclined face. The upper inclined face is constituted by an inclined face that inclines and extends closer to the center of the substrate storing space 27 toward the upper direction D21.

The lower inclined face and the upper inclined face form a V-shaped groove, which is recessed away from the center of the substrate storing space 27, with which an end portion of the substrate W can engage. When the container main body opening portion 21 is closed by the lid body 3, the substrate W slides up with respect to the lower inclined face, and when the substrate W reaches the position of the vertex of the V-shaped groove, the V-shaped groove supports an edge portion of the substrate W. The V-shaped groove may be substantially V-shaped as viewed as a whole, and may additionally have a face substantially parallel to the D1-D3 plane or a face substantially parallel to the D2-D3 plane. The back side substrate support portion 6 may be integrated with the back wall 22.

Figure 3:
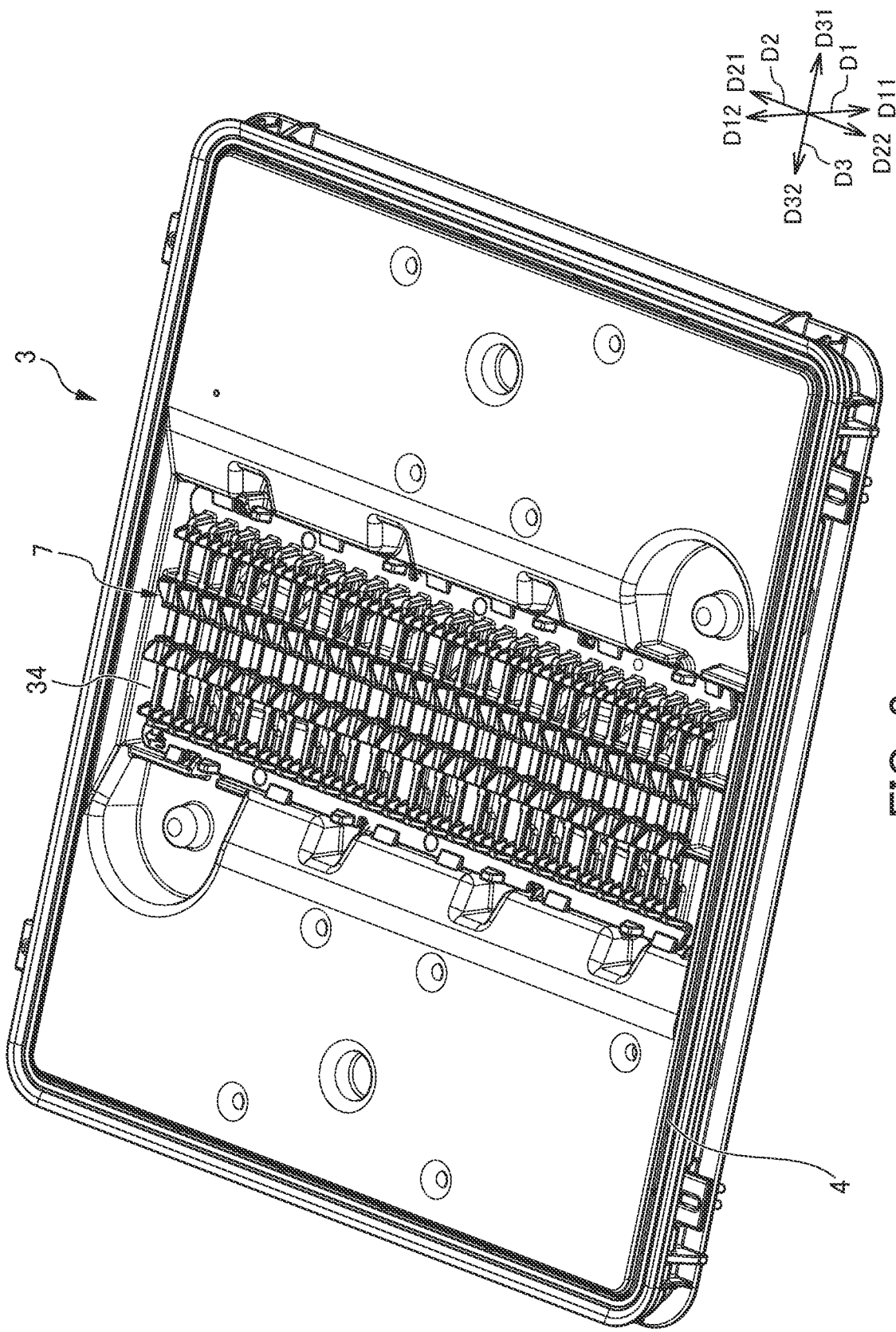
FIG. 3 is a perspective view of a lid body 3 of the substrate storing container 1 according to the first embodiment of the present invention.
Figure 4:
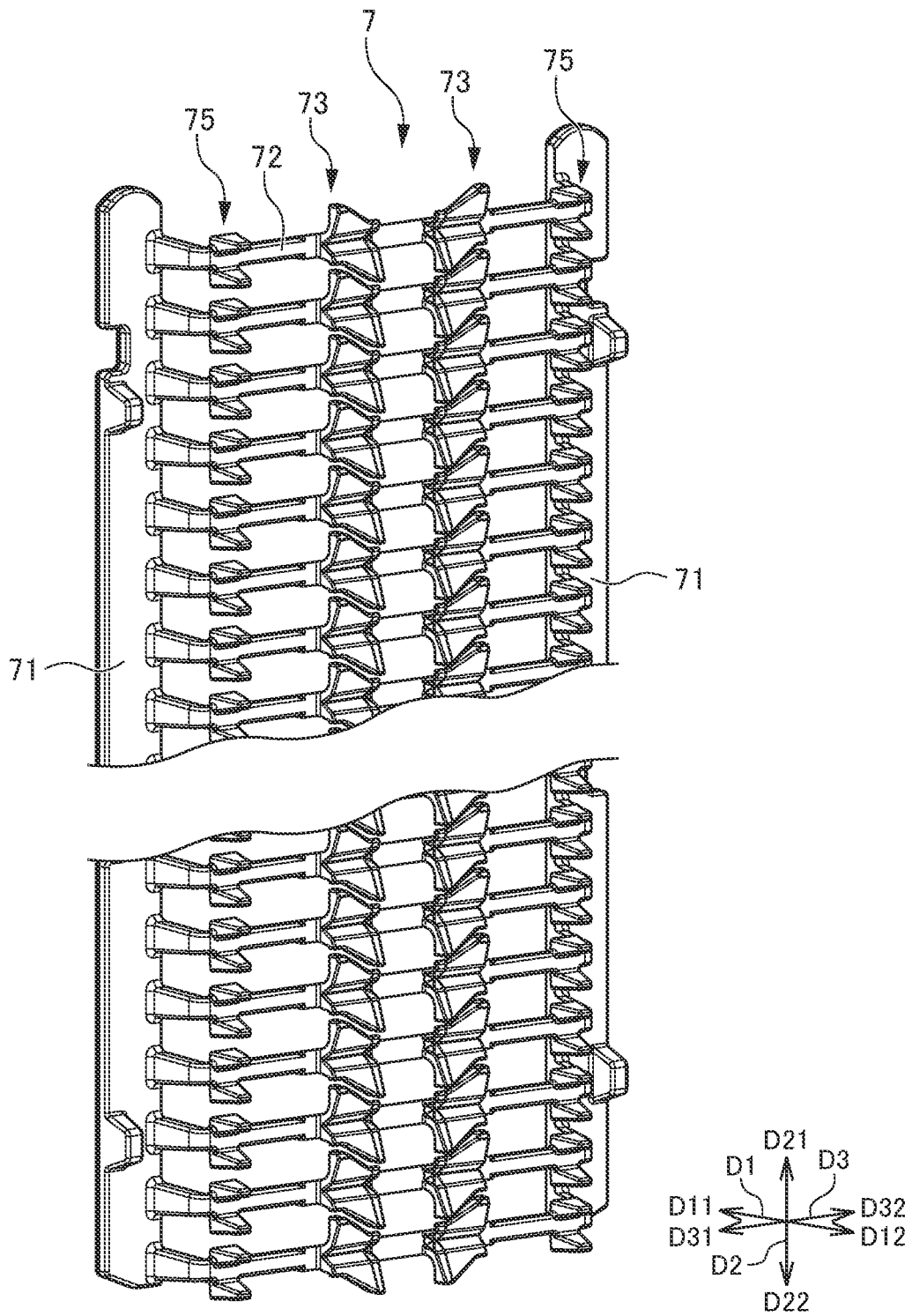
FIG. 4 is a perspective view of a front retainer 7 of the substrate storing container 1 according to the first embodiment of the present invention.
Figure 5:
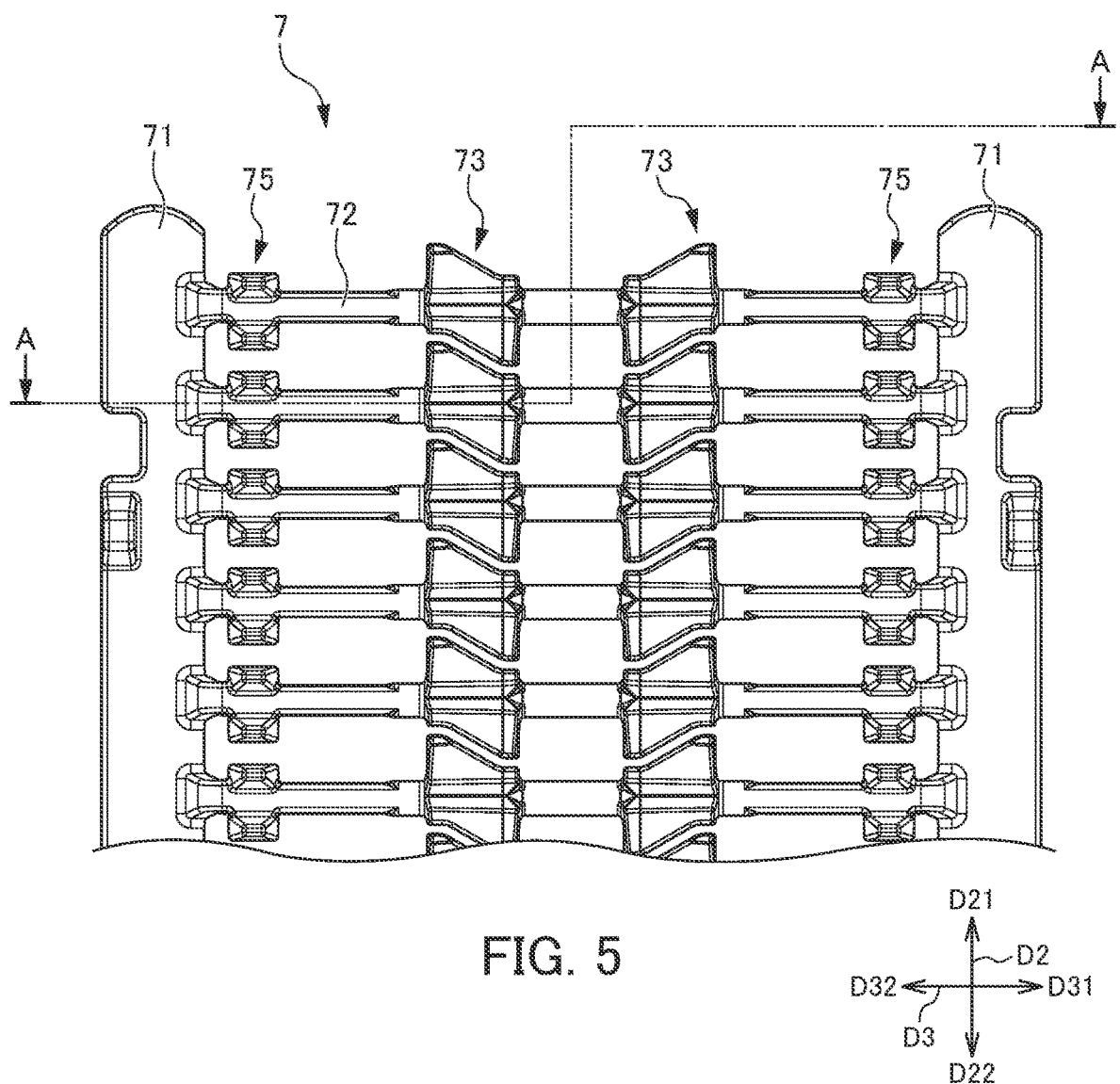
FIG. 5 is a partial front view of the front retainer 7 of the substrate storing container 1 according to the first embodiment of the present invention.

The lid body 3 and the front retainer 7 will be described in detail. FIG. 3 is a perspective view of the lid body 3 of the substrate storing container 1 according to the first embodiment of the present invention. FIG. 4 is a perspective view of the front retainer 7 of the substrate storing container 1 according to the first embodiment of the present invention. FIG. 5 is a partial front view of the front retainer 7 of the substrate storing container 1 according to the first embodiment of the present invention.

As shown in FIG. 1, etc., the lid body 3 has a substantially rectangular shape substantially corresponding to the shape of the opening circumferential portion 28 of the container main body 2. The lid body 3 is removably attached to the opening circumferential portion 28 of the container main body 2, and the lid body 3 can close the container main body opening portion 21 by attaching the lid body 3 to the opening circumferential portion 28. An annular sealing member 4 is attached to the inner face of the lid body 3 (the face on the back side of the lid body 3 in FIG. 1). The sealing member 4 may be made of various types of thermoplastic elastomers such as polyester type and polyolefin type that are elastically deformable, fluorine containing rubber, silicon rubber, or the like. The sealing member 4 is arranged so as to go around an outer edge portion of the lid body 3.

When the lid body 3 is attached to the opening circumferential portion 28, the sealing member 4 is sandwiched between the opening circumferential portion 28 and the inner face of the lid body 3 to be elastically deformed, and thus the lid body 3 closes the container main body opening portion 21 in an airtight state. By removing the lid body 3 from the opening circumferential portion 28, the substrate W can be placed in and removed from the substrate storing space 27 inside the container main body 2.

The lid body 3 includes a lid body main body that forms the outer shape of the lid body 3, and a latching mechanism is provided in the lid body main body. The latching mechanism is provided in the vicinity of both left and right ends of the lid body main body. As shown in FIG. 1, the latching mechanism includes two upper side latch portions 32A that can project from the upper side of the lid body main body in the upper direction D21 and two lower side latch portions 32B that can project from the lower side of the lid body main body in the lower direction D22. The two upper side latch portions 32A are respectively arranged in the vicinity of both left and right ends of the upper side of the lid body main body, and the two lower side latch portions 32B are respectively arranged in the vicinity of both left and right ends of the lower side of the lid body main body.

An operation portion 33 is provided on the outer face side of the lid body main body. By operating the operation portion 33 from the front side of the lid body main body, it is possible to cause the upper side latch portions 32A and the lower side latch portions 32B to project from the upper side and the lower side of the lid body main body, or it is also possible to cause the upper side latch portions 32A and the lower side latch portions 32B not to project from the upper side and the lower side of the lid body main body. By the upper side latch portions 32A projecting from the upper side of the lid body main body in the upper direction D21 to engage with the latch engagement recessed portions 231A and 231B of the container main body 2, and the lower side latch portions 32B projecting from the lower side of the lid body main body in the lower direction D22 to engage with the latch engagement recessed portions 241A and 241B of the container main body 2, the lid body 3 is fixed to the opening circumferential portion 28 of the container main body 2.

As shown in FIG. 3, on the inner side of the lid body main body constituting the lid body 3, a recessed portion 34, which is recessed outward (forward direction D11) of the substrate storing space 27, is formed. The front retainer 7 is fixed to a part of the lid body main body inside the recessed portion 34.

Figure 6:
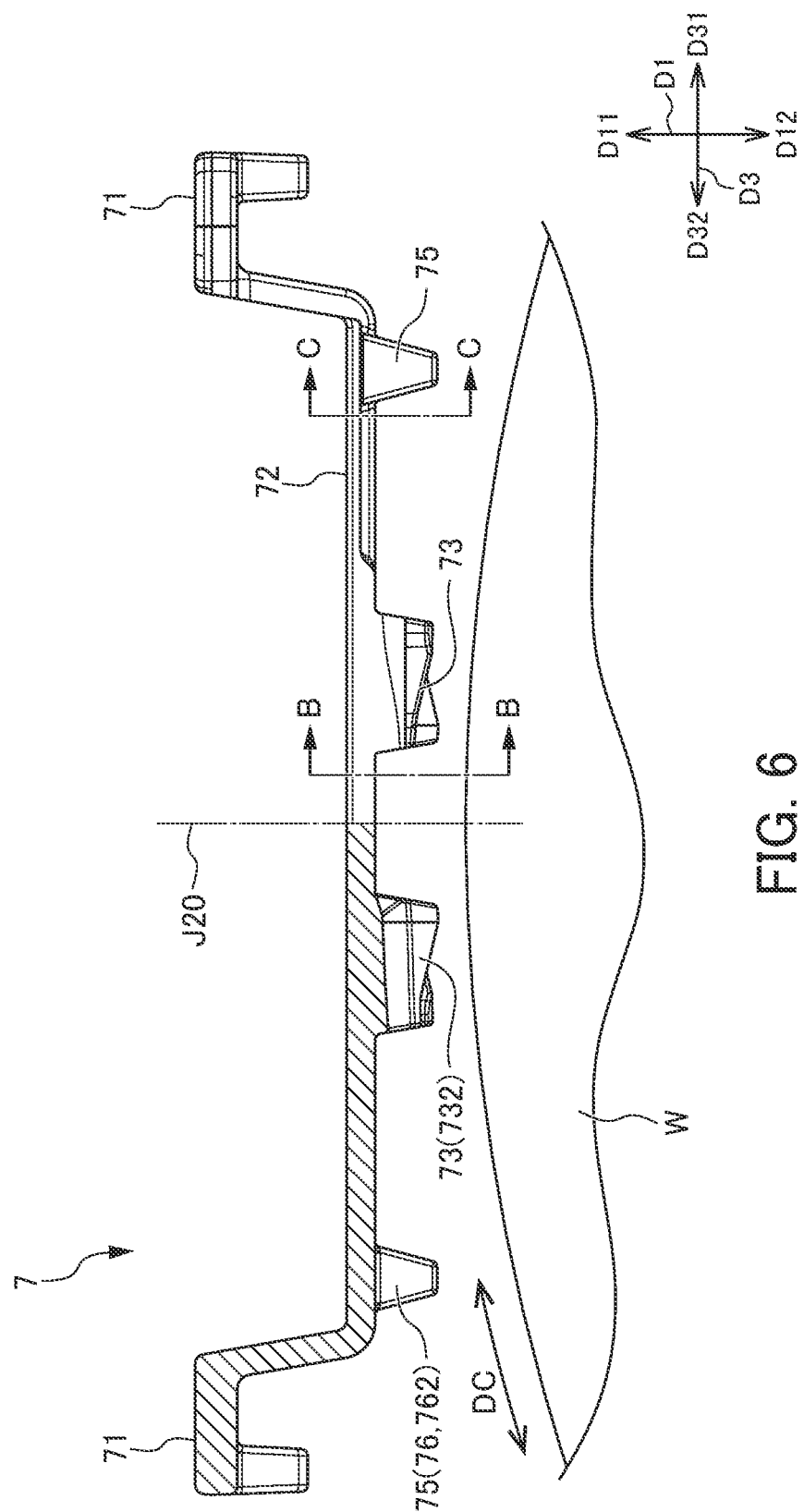
FIG. 6 is a sectional view taken along line A-A in FIG. 5.

FIG. 6 is a sectional view taken along line A-A in FIG. 5.

Figure 7A:
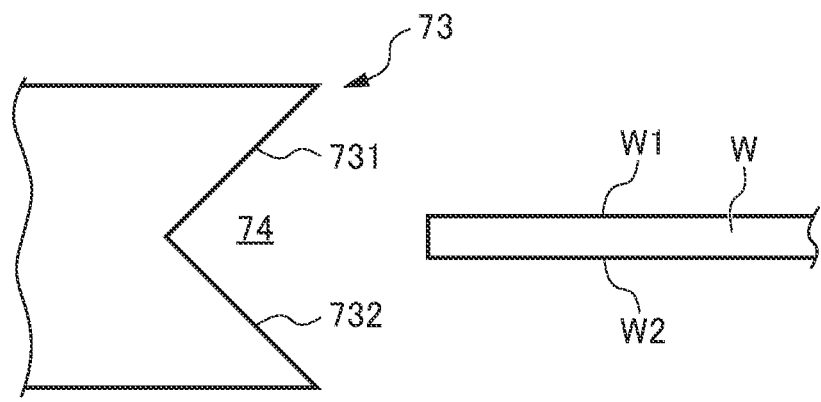
FIG. 7A is a sectional view taken along line B-B in FIG. 6.
Figure 7A:
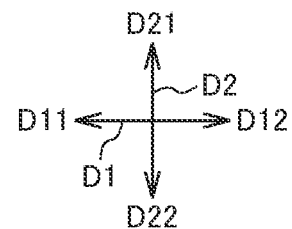

FIG. 7A is a sectional view taken along line B-B in FIG. 6.

Figure 7B:
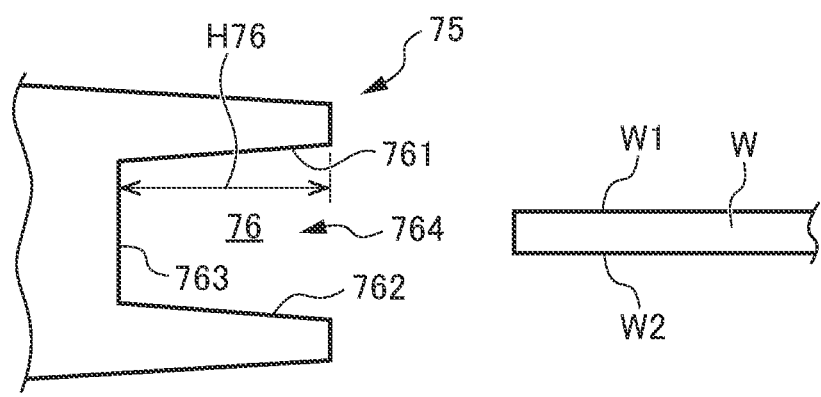
FIG. 7B is a sectional view taken along line C-C in FIG. 6.
Figure 7B:
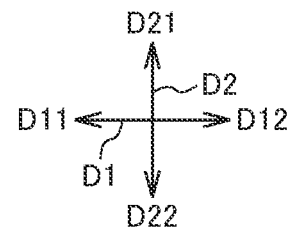

FIG. 7B is a sectional view taken along line C-C in FIG. 6.

Figure 8:
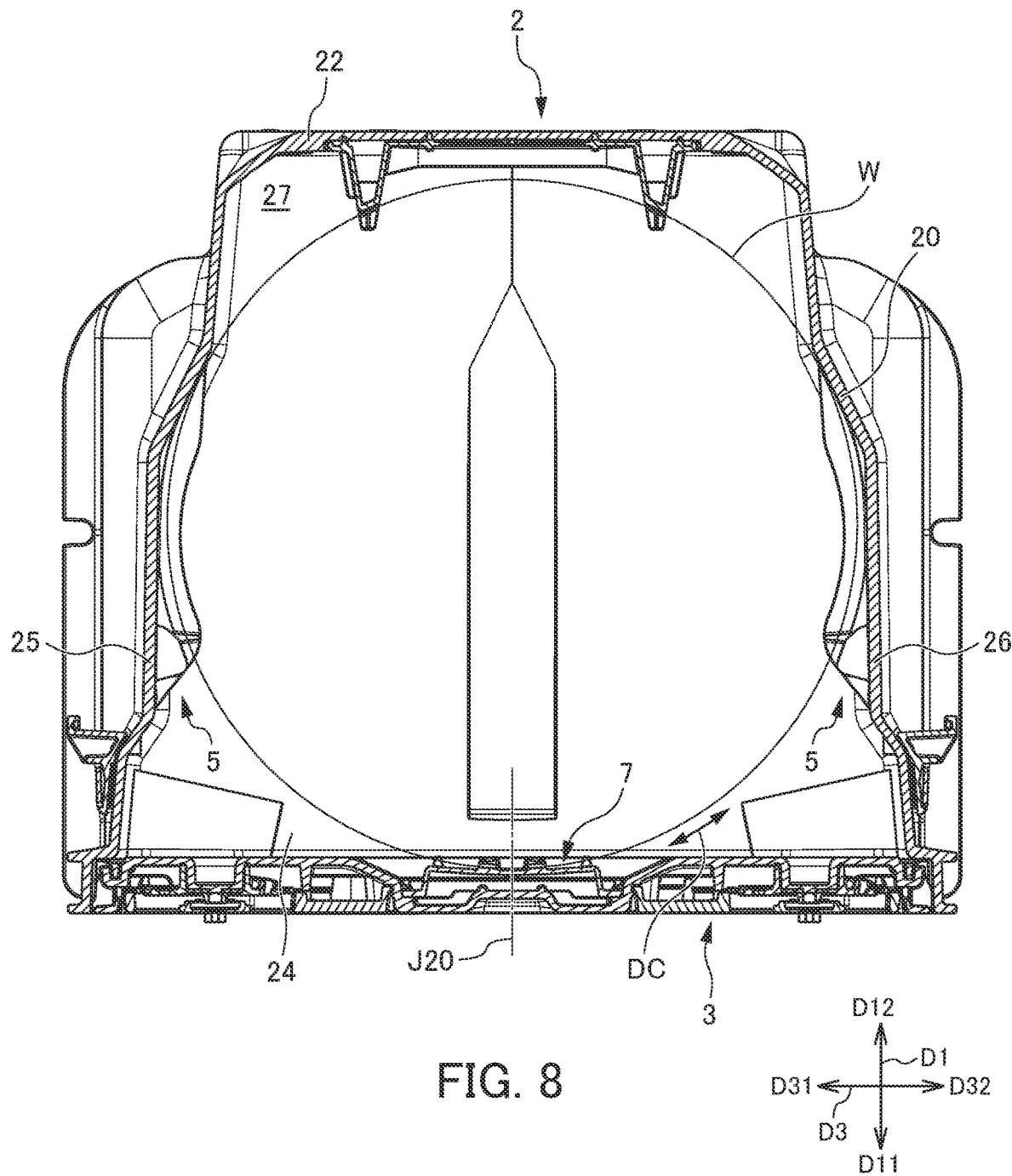
FIG. 8 is a plain sectional view showing the positional relationship between the substrate storing container 1 and the substrate W when the lid is closed.

FIG. 8 is a plain sectional view showing the positional relationship between the substrate storing container 1 and the substrate W when the lid is closed.

Figure 9:
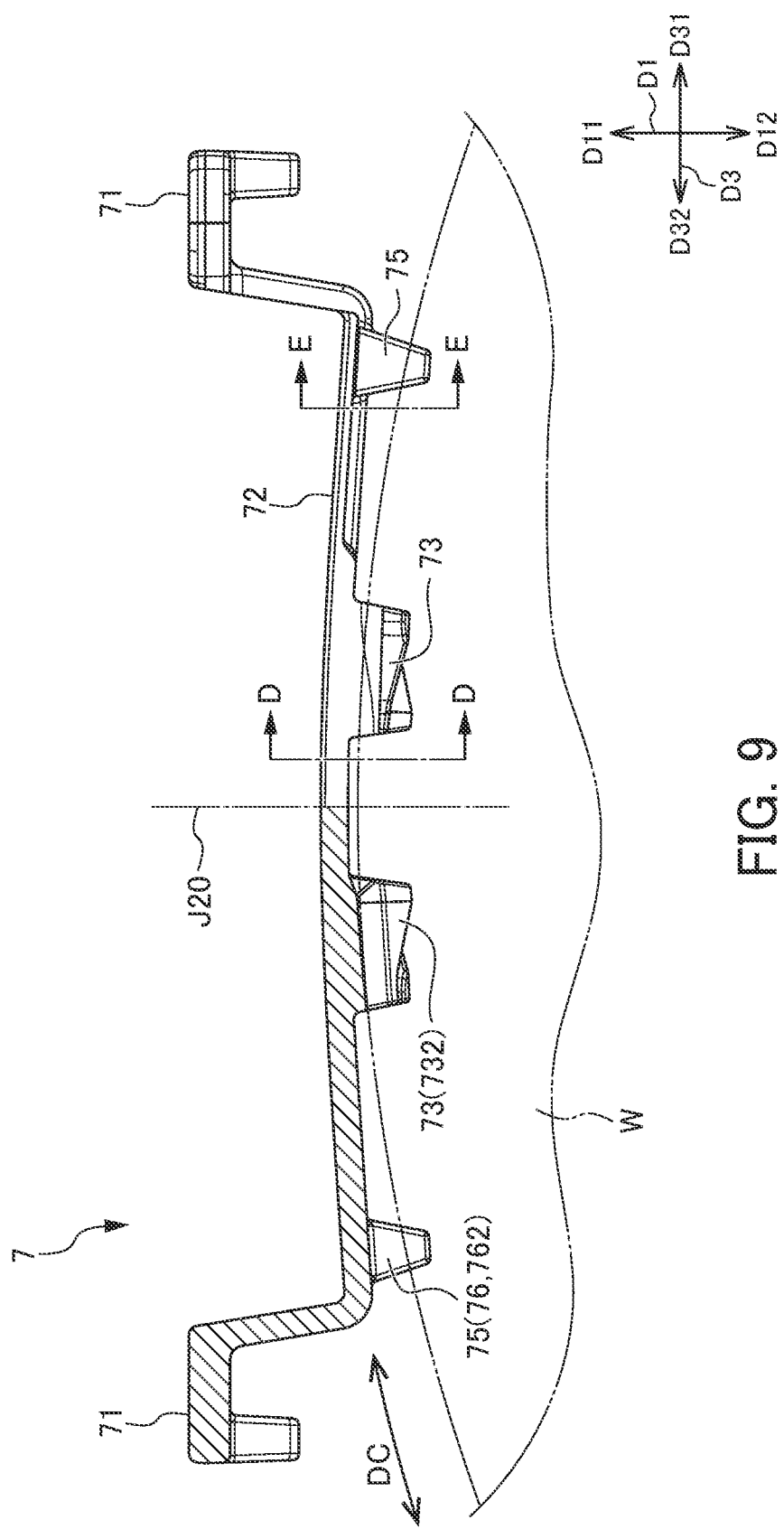
FIG. 9 is a partially enlarged view of FIG. 8 (corresponding to FIG. 6)

FIG. 9 is a partially enlarged view of FIG. 8 (corresponding to FIG. 6).

Figure 10A:
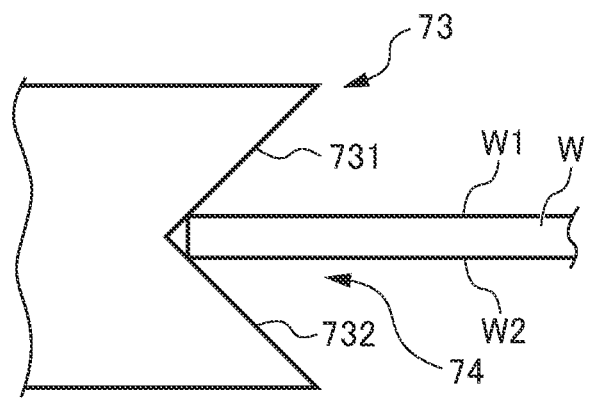
FIG. 10A is a sectional view taken along line D-D in FIG. 9.
Figure 10A:
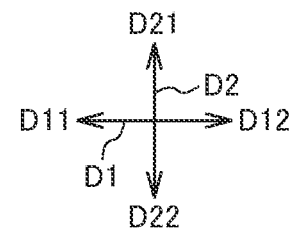

FIG. 10A is a sectional view taken along line D-D in FIG. 9.

Figure 10B:
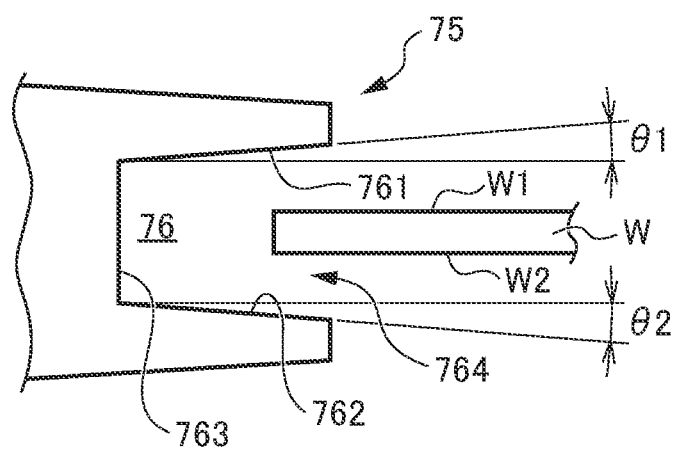
FIG. 10B is a sectional view taken along line E-E in FIG. 9.
Figure 10B:
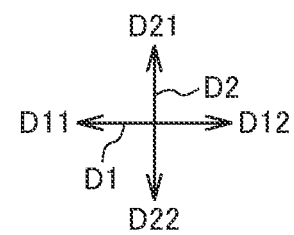

FIG. 10B is a sectional view taken along line E-E in FIG. 9.

FIG. 11 is a partially enlarged view showing the amount by which each of the lid body side substrate support portion and the substrate edge portion auxiliary portion is displaced between the lid open state and the lid closed state.

As shown in FIGS. 4 to 11, the front retainer 7 includes the lid body side substrate support portion 73, the substrate edge portion auxiliary portion 75, a leg portion 72, and a vertical frame 71. The lid body side substrate support portion 73 and the substrate edge portion auxiliary portion 75 that correspond to the same substrate W are connected to each other via the leg portion 72.

Two of the lid body side substrate support portions 73 are arranged to form a pair to be spaced apart from each other at a predetermined interval in the left/right direction D3. The lid body side substrate support portions 73 thus arranged to form a pair are provided in 25 pairs in parallel in the upper/lower direction D2, and are respectively supported by the leg portions 72 that are elastically deformable. The leg portions 72 respectively extend away from each other, from the lid body side substrate support portions 73 arranged two by two in the left/right direction D3, and are bent in the forward direction D11. As shown in FIGS. 4 and 5, the vertical frames 71 extending in parallel along the upper/lower direction D2 are integrally formed with the leg portions 72 at ends of the leg portions 72. When the substrate W is stored in the substrate storing space 27 and the lid body 3 is closed, the lid body side substrate support portion 73 holds and supports an end edge of an edge portion of the substrate W while biasing it toward the center of the substrate storing space 27 with the elastic force of the leg portion 72.

As shown in FIGS. 7A and 10A, the lid body side substrate support portion 73 has an upper inclined face 731 and a lower inclined face 732.

The upper inclined face 731 is in contact with an end edge of the front side (upper face) of the substrate W when the container main body opening portion 21 is closed by the lid body 3. The lower inclined face 732 is in contact with an end edge of the back side (lower face) of the substrate W. Specifically, the upper inclined face 731 is constituted by an inclined face that inclines and extends closer to the center of the substrate storing space 27 in the forward/backward direction D1 toward the upper direction D21. The lower inclined face 732 is constituted by an inclined face that inclines and extends away from the center of the substrate storing space 27 in the forward/backward direction D1 toward the upper direction D21. The upper inclined face 731 and the lower inclined face 732 form a V-shaped groove 74, which is recessed away from the center of the substrate storing space 27. When the container main body opening portion 21 is closed by the lid body 3, an end edge of the front side of the substrate W and an end edge of the back side of the substrate W are in contact with the upper inclined face 731 and the lower inclined face 732, respectively.

Two of the substrate edge portion auxiliary portions 75 are arranged to form a pair to be spaced apart from each other at a predetermined interval in the left/right direction D3. The substrate edge portion auxiliary portions 75 thus arranged to form a pair are provided in 25 pairs in parallel in the upper/lower direction D2, and are respectively supported by the leg portions 72. In the present embodiment, the substrate edge portion auxiliary portion 75 is disposed between the lid body side substrate support portion 73 and the vertical frame 71 in the left/right direction D3.

The substrate edge portion auxiliary portion 75 is disposed on a part of the lid body 3 that faces the substrate storing space 27 when the container main body opening portion 21 is closed by the lid body 3. In the substrate edge portion auxiliary portions 75, a plurality of auxiliary grooves 76 each having an opening greater than the thickness of the edge portion of the substrate W so that the edge portion of the substrate W can be inserted are formed. The groove forming faces that form the auxiliary groove 76 include a front side facing face portion 761, a back side facing face portion 762, and a bottom face portion 763.

As shown in FIG. 10B, when the container main body opening portion 21 is closed by the lid body 3, the edge portion of the substrate W is inserted into the auxiliary groove 76 in a non-contact state in which a space is formed between the edge portion of the substrate W and each of the groove forming faces (the front side facing face portion 761, the back side facing face portion 762, and the bottom face portion 763) of the auxiliary groove 76, and the edge portion of the substrate W is not in contact with the groove forming faces.

As shown in FIGS. 7B and 10B, the auxiliary groove 76 has a substantially rectangular shape in sectional view. The auxiliary groove 76 has opposed groove forming faces (front side facing face portion 761 and back side facing face portion 762). When the container main body opening portion 21 is closed by at least the lid body 3, edge portions of the plurality of substrates W are respectively inserted into the auxiliary grooves 76. As shown in FIG. 6, the auxiliary groove 76 is disposed further outward in the circumferential direction DC of the edge portion of the substrate W than the lid body side substrate support portion 73 with respect to the central axis J20 of the tubular wall portion 20.

When the container main body opening portion 21 is closed by the lid body 3, the front side facing face portion 761 is substantially parallel to a front side W1 of the substrate W, and a part of the front side facing face portion 761 faces the front side W1 in the upper/lower direction D2 that is a direction connecting the front side W1 and a back side W2. When the container main body opening portion 21 is closed by the lid body 3, the back side facing face portion 762 is substantially parallel to the back side W2 of the substrate W, and a part of the back side facing face portion 762 faces the back side W2 in the upper/lower direction D2 that is a direction connecting the front side W1 and the back side W2. The bottom face portion 763 forms the bottom of the auxiliary groove 76, and is connected to the front side facing face portion 761 and the back side facing face portion 762.

The front side facing face portion 761 and the back side facing face portion 762 are substantially straight, flat planes. The front side facing face portion 761 and the back side facing face portion 762 form a pair of inclined faces that are slightly inclined so that an opening 764 of the auxiliary groove 76 slightly widens from the bottom of the auxiliary groove 76 toward the opening 764. An angle θ1 formed between the front side W1 of the substrate W and the front side facing face portion 761 and/or an angle θ2 formed between the back side W2 and the back side facing face portion 762 are/is, for example, 30 degrees or less, preferably 15 degrees or less.

The auxiliary groove 76 has a depth H76 (see FIG. 7B) such that, when the container main body opening portion 21 is not closed by the lid body 3 and the edge portions of the plurality of substrates W are supported by the substrate support plate-like portions 5 serving as the side substrate support portions, the edge portions of the substrates W are not inserted into the auxiliary grooves 76 (see FIG. 7B), while when the container main body opening portion 21 is closed by the lid body 3, the edge portions of the substrates W are inserted into the auxiliary grooves 76 (see FIG. 10B).

As shown in FIG. 11, when the container main body opening portion 21 is closed by the lid body 3, the lid body side substrate support portion 73 of the front retainer 7 is elastically displaceable by a first displacement amount H73 in a direction from the other end portion to the one end portion of the container main body 2 (forward direction D11). When the container main body opening portion 21 is closed by the lid body 3, the substrate edge portion auxiliary portion 75 is elastically displaceable by a second displacement amount H75 smaller than the first displacement amount H73 in the direction from the other end portion to the one end portion of the container main body 2 (forward direction D11).

The operation when the substrate W is stored in the substrate storing space 27 and the container main body opening portion 21 is closed by the lid body 3 in the substrate storing container 1 described above will be described. First, as shown in FIG. 1, the container main body 2 is disposed such that the forward/backward direction D1 and the left/right direction D3 are parallel to the horizontal plane. Next, the plurality of substrates W are placed on the substrate support plate-like portions 5 and the lower inclined faces of the back side substrate support portions 6. At this time, as shown in FIGS. 6 to 7B, the substrate W is not positioned in the V-shaped groove 74 of the lid body side substrate support portion 73 and the auxiliary groove 76 of the substrate edge portion auxiliary portion 75 (not overlap in plain view).

Next, the lid body 3 is brought close to the container main body opening portion 21, and as shown in FIGS. 8 to 10A, the lower inclined face 732 of the front retainer 7 is brought into contact with the end edge of the back side (lower face) of the substrate W, and the upper inclined face 731 of the front retainer 7 is brought into contact with the end edge of the front side of the substrate W. When the lid body 3 is further brought close to the container main body opening portion 21, the front portion of the substrate W is pressed in the backward direction D12 by the lower inclined face 732 and the upper inclined face 731 of the front retainer 7, the rear portion of the substrate W is pressed in the forward direction D11 by contacting the back side substrate support portion 6, and the substrate W is held so as to be sandwiched from the forward direction D11 and the backward direction D12. The part of the substrate W on the back side (backward direction D12 side) moves in the upper/lower direction D2, while the part of the substrate W on the opening side (forward direction D11 side) does not move in the upper/lower direction D2. At this time, as shown in FIG. 10B, the substrate W is positioned in the auxiliary groove 76 of the substrate edge portion auxiliary portion 75 (overlap in plain view).

Thereafter, the substrate storing container 1 is rotated by 90 degrees, and the container main body opening portion 21 is conveyed in a state in which the container main body opening portion 21 faces vertically upward, or the container main body opening portion 21 is conveyed in a state in which the container main body opening portion 21 faces horizontally without being rotated by 90 degrees.

When an impact is applied to the substrate storing container 1 from the outside during the conveyance of the substrate storing container 1 in a state in which the substrate W is stored, the substrate W that is in contact with the V-shaped groove 74 of the lid body side substrate support portion 73 may reach a point close to becoming displaced from the V-shaped groove 74. Even in such a case, since the substrate W is not in contact with the auxiliary groove 76 of the substrate edge portion auxiliary portion 75, it is difficult for the substrate W to become displaced from the auxiliary groove 76 of the substrate edge portion auxiliary portion 75. Therefore, the substrate W is prevented from becoming displaced from the lid body side substrate support portion 73, i.e., the occurrence of cross slot is suppressed.

According to the substrate storing container 1 of the first embodiment having the above configuration, the following effects can be obtained. The substrate storing container 1 of the first embodiment includes the container main body 2, the lid body 3, the lid body side substrate support portion 73, the back side substrate support portion 6, and the substrate edge portion auxiliary portion 75. The container main body 2 includes the tubular wall portion 20 having the container main body opening portion formed at one end portion and the other end portion being closed, and the substrate storing space 27 formed by the inner faces of the wall portion 20 and capable of storing the plurality of substrates W and communicating with the container main body opening portion 21. The lid body 3 is removably attached to the container main body opening portion 21 and capable of closing the container main body opening portion 21. The lid body side substrate support portion 73 is disposed on a part of the lid body 3 that faces the substrate storing space 27 and is capable of supporting the edge portions of the plurality of substrates W when the container main body opening portion 21 is closed by the lid body 3. The back side substrate support portion 6 is disposed so as to form a pair with the lid body side substrate support portion 73 in the substrate storing space 27, capable of supporting the edge portions of the plurality of substrates W, and supports the plurality of substrates W with the edge portions of the plurality of substrates W arranged in parallel in cooperation with the lid body side substrate support portion 73 when the container main body opening portion 21 is closed by the lid body 3. The substrate edge portion auxiliary portion 75 is disposed on a part of the lid body 3 that faces the substrate storing space 27 when the container main body opening portion 21 is closed by the lid body 3. The substrate edge portion auxiliary portions 75 include the plurality of auxiliary grooves 76 each having the opening greater than the thickness of the edge portion of the substrate W so that the edge portion of the substrate W can be inserted. The plurality of auxiliary grooves 76 each have opposed groove forming faces 761 and 762. When the container main body opening portion 21 is closed by at least the lid body 3, the edge portions of the plurality of substrates W are respectively inserted into the auxiliary grooves 76. The auxiliary grooves 76 are disposed further outward in the circumferential direction DC of the edge portions of the substrates W than the lid body side substrate support portions 73 with respect to the central axis J20 of the tubular wall portion 20. When the container main body opening portion 21 is closed by the lid body 3, the edge portion of the substrate W is inserted into the auxiliary groove 76 in a non-contact state in which a space is formed between the edge portion of the substrate W and each of the groove forming faces 761 and 762, and the edge portion of the substrate W is not in contact with the groove forming faces 761 and 762.

According to the above configuration, even if an impact is applied to the substrate storing container 1 from the outside during the conveyance of the substrate storing container 1 in a state in which the substrate W is stored, and the substrate W that is in contact with the lid body side substrate support portion 73 reaches a point close to becoming displaced from the lid body side substrate support portion 73, it is difficult for the substrate W to become displaced from the auxiliary groove 76 of the substrate edge portion auxiliary portion 75 because the substrate W is not in contact with the auxiliary groove 76 of the substrate edge portion auxiliary portion 75. Therefore, the substrate W can be protected against the impact acting on the substrate storing container 1, and the substrate W can be prevented from becoming displaced from the lid body side substrate support portion 73, i.e., the occurrence of cross slot can be suppressed.

The lid body side substrate support portion 73 and the substrate edge portion auxiliary portion 75 that correspond to the same substrate W are connected to each other.

With the above configuration, with regard to the lid body side substrate support portion 73 and the substrate edge portion auxiliary portion 75 that correspond to the same substrate W, when the substrate W presses and displaces the lid body side substrate support portion 73, the substrate edge portion auxiliary portion 75 is also displaced in conjunction. Therefore, the lid body side substrate support portion 73 and the substrate edge portion auxiliary portion 75 are respectively disposed at appropriate positions for performing the main functions of the lid body side substrate support portion 73 and the substrate edge portion auxiliary portion 75 in conjunction with each other.

Further, the substrate storing container 1 of the first embodiment includes side substrate support portions (substrate support plate-like portions 5) disposed to form a pair in the substrate storing space 27. The side substrate support portions can support the edge portions of the plurality of substrates W in a state in which adjacent substrates among the plurality of substrates W are arranged in parallel to be spaced apart from each other by a predetermined interval when the container main body opening portion 21 is not closed by the lid body 3. The auxiliary grooves 76 each have the depth H76 such that, when the container main body opening portion 21 is not closed by the lid body 3 and the edge portions of the plurality of substrates W are supported by the side substrate support portions (substrate support plate-like portions 5), the edge portions of the substrates W are not inserted into the auxiliary grooves 76, and when the container main body opening portion 21 is closed by the lid body 3, the edge portions of the substrates W are inserted into the auxiliary grooves 76.

With the above configuration, even if the substrates W move greatly due to an unintended event when the edge portions of the plurality of substrates W are supported by the side substrate support portions (substrate support plate-like portions 5), the edge portions of the substrates W are prevented from contacting the auxiliary grooves 76.

Second Embodiment

Figure 12:
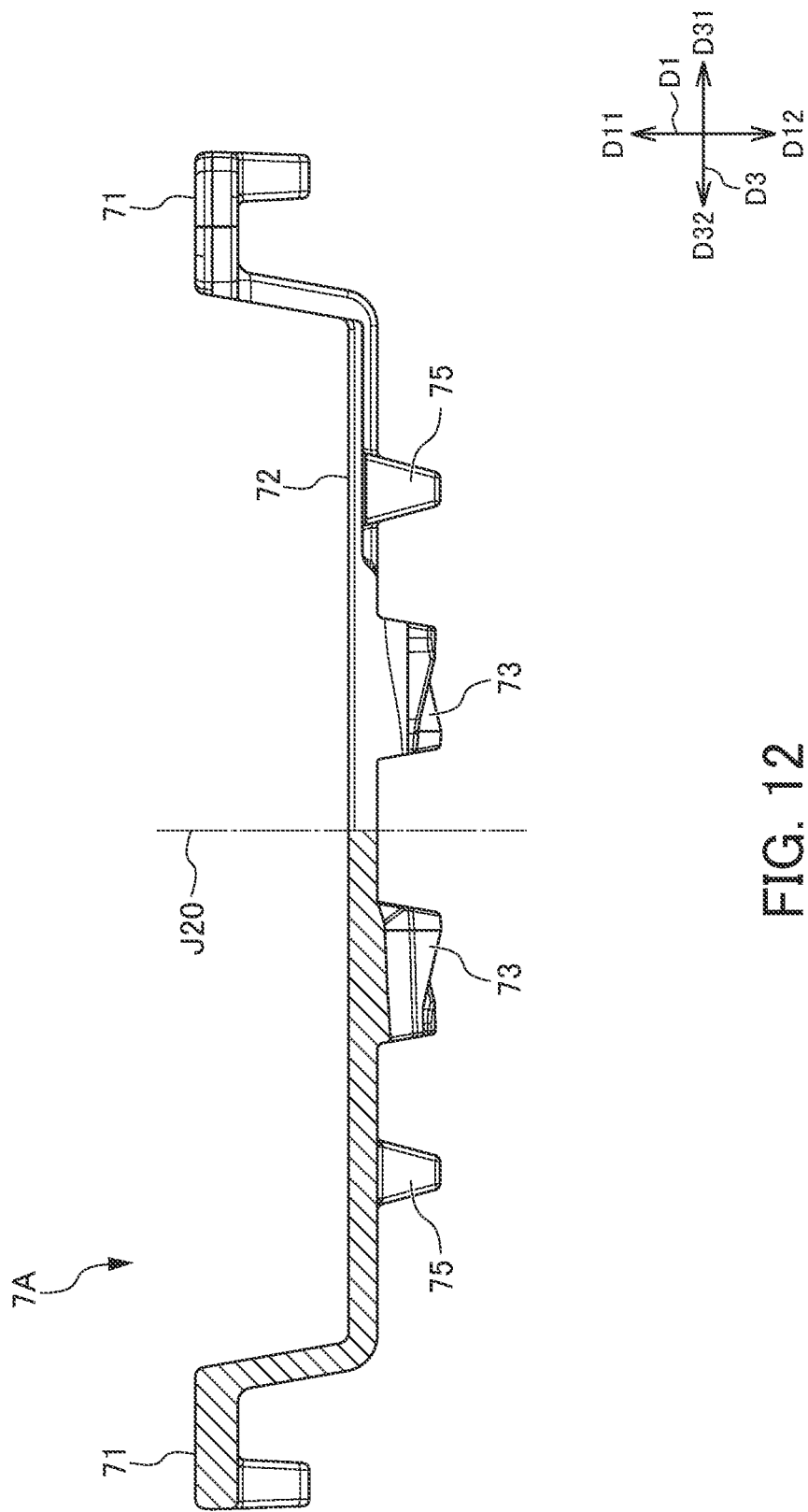
FIG. 12 is a sectional view of a front retainer 7A according to a second embodiment of the present invention (corresponding to FIG. 6)

A substrate storing container according to a second embodiment of the present invention will be described with reference to the drawings. FIG. 12 is a sectional view of a front retainer 7A according to the second embodiment of the present invention (corresponding to FIG. 6).

As shown in FIG. 12, in the second embodiment, in the lid body side substrate support portion 73, the substrate edge portion auxiliary portion 75 is disposed further inward in the left/right direction D3 (closer to the central axis J20 of the wall portion 20) as compared to the first embodiment. Since the other features of the second embodiment are the same as those of the first embodiment, the same components are denoted by the same reference numerals, and description thereof will be omitted.

Third Embodiment

Figure 13:
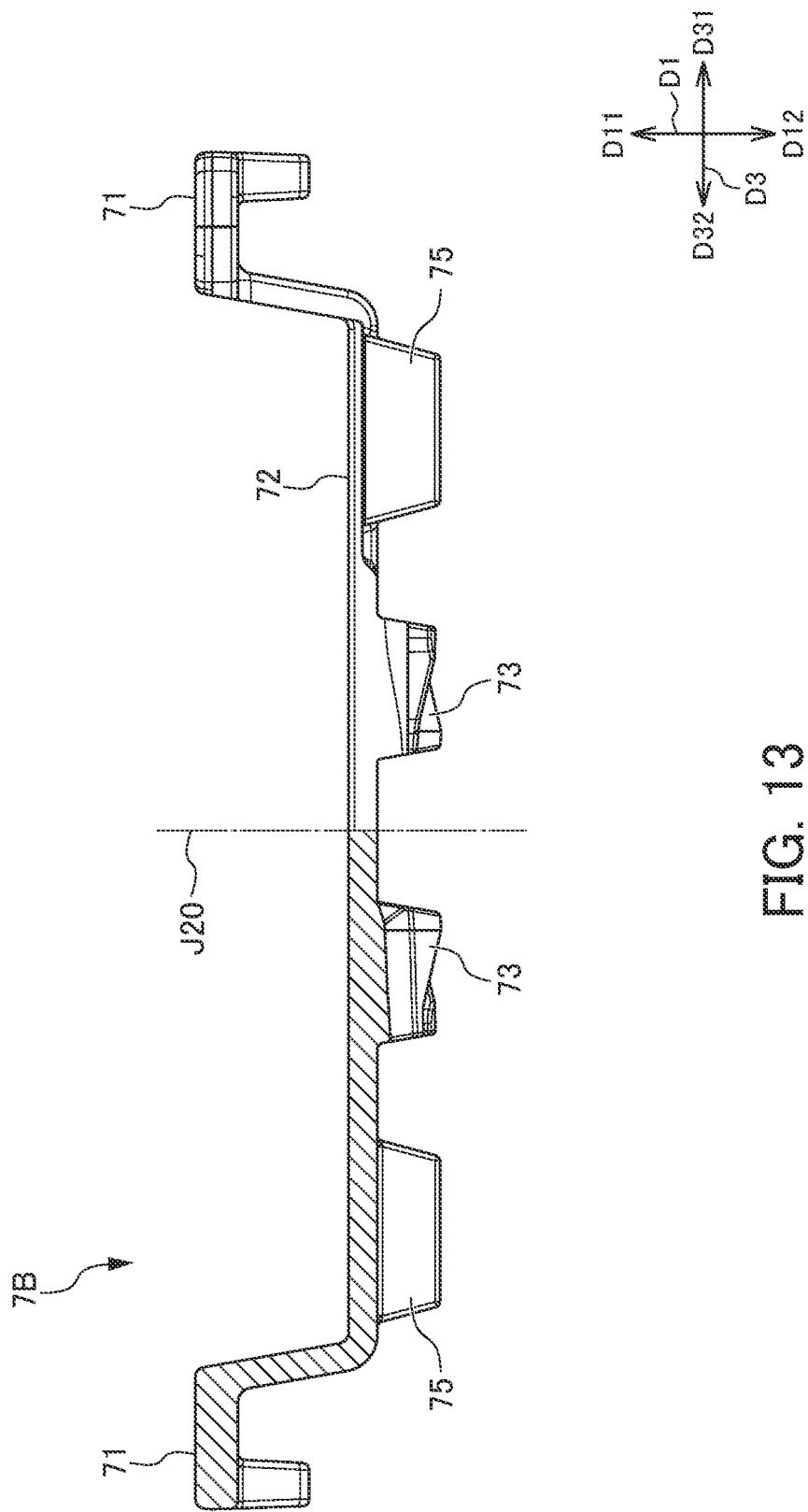
FIG. 13 is a sectional view of a front retainer 7B according to a third embodiment of the present invention (corresponding to FIG. 6)

A substrate storing container according to a third embodiment of the present invention will be described with reference to the drawings. FIG. 13 is a sectional view of a front retainer 7B according to a third embodiment of the present invention (corresponding to FIG. 6).

As shown in FIG. 13, in the third embodiment, in the lid body side substrate support portion 73, the width (width in the left/right direction D3) of the substrate edge portion auxiliary portion 75 is greater than that in the first embodiment. Since the other features of the third embodiment are the same as those of the first embodiment, the same components are denoted by the same reference numerals, and description thereof will be omitted.

Fourth Embodiment

Figure 14:
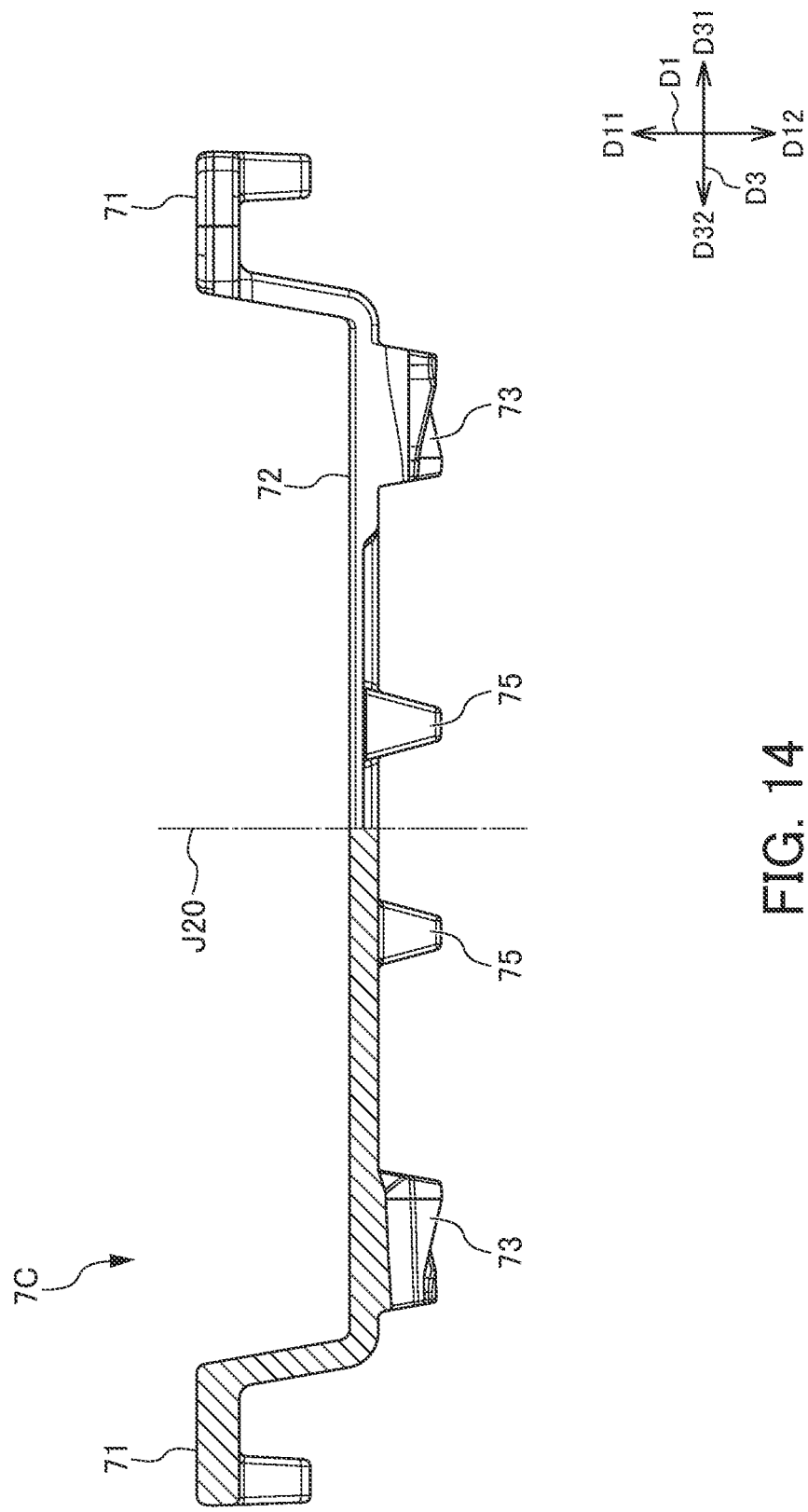
FIG. 14 is a sectional view of a front retainer 7C according to a fourth embodiment of the present invention (corresponding to FIG. 6).

A substrate storing container according to a fourth embodiment of the present invention will be described with reference to the drawings. FIG. 14 is a sectional view of a front retainer 7C according to a fourth embodiment of the present invention (corresponding to FIG. 6).

As shown in FIG. 14, in the fourth embodiment, in the lid body side substrate support portion 73, the substrate edge portion auxiliary portion 75 is disposed further inward in the left/right direction D3 (closer to the central axis J20 of the wall portion 20), and the lid body side substrate support portion 73 is disposed further outward in the left/right direction D3 as compared to the first embodiment. From another point of view, the plurality of auxiliary grooves 76 of the substrate edge portion auxiliary portions 75 are arranged further inward in the circumferential direction DC of the edge portions of the substrates W than the lid body side substrate support portions 73 with respect to the central axis J20 of the wall portion 20. Since the other features of the fourth embodiment are the same as those of the first embodiment, the same components are denoted by the same reference numerals, and description thereof will be omitted.

The present invention is not limited to the embodiments described above, and can be modified within the technical scope of the claims.

For example, the shapes of the container main body and the lid body and the number and dimensions of the substrates W that can be stored in the container main body are not limited to the shapes of the container main body 2 and the lid body 3 and the number and dimensions of the substrates W that can be stored in the container main body 2 in the present embodiments. In other words, the features of the side substrate support portion (substrate support plate-like portion 5), the front retainer 7, and the back side substrate support portion 6 are not limited to the features of the embodiments. Further, although the substrate W in the present embodiments is a silicon wafer having a diameter of 300 mm, the diameter of the substrate is not limited to this value.

EXPLANATION OF REFERENCE NUMERALS 1 substrate storing container
2 container main body
3 lid body
5 substrate support plate-like portion (side substrate support portion)
6 back side substrate support portion
21 container main body opening portion
27 substrate storing space
28 opening circumferential portion
73 lid body side substrate support portion
75 substrate edge portion auxiliary portion
76 auxiliary groove 761 front side facing face portion (groove forming face)
762 back side facing face portion (groove forming face)
DC circumferential direction
H73 first displacement amount
H75 second displacement amount
H76 depth
J20 central axis
W substrate
θ1 angle
θ2 angle

The invention claimed is:

1. A substrate storing container, comprising:
a container main body that includes a tubular wall portion having a container main body opening portion formed at one end portion and the other end portion being closed, and a substrate storing space formed by an inner face of the tubular wall portion and capable of storing a plurality of substrates and communicating with the container main body opening portion;
a lid body removably attached to the container main body opening portion and capable of closing the container main body opening portion;
a lid body side substrate support portion disposed on a part of the lid body that faces the substrate storing space and capable of supporting edge portions of the plurality of substrates when the container main body opening portion is closed by the lid body;
a back side substrate support portion disposed so as to form a pair with the lid body side substrate support portion in the substrate storing space, capable of supporting edge portions of
the plurality of substrates, and supporting the plurality of substrates with the edge portions of the plurality of substrates arranged in parallel in cooperation with the lid body side substrate support portion when the container main body opening portion is closed by the lid body; and
a substrate edge portion auxiliary portion disposed on a part of the lid body that faces the substrate storing space when the container main body opening portion is closed by the lid body, the substrate edge portion auxiliary portion including a plurality of auxiliary grooves each having an opening greater than a thickness of an edge portion of each of the plurality of substrates so that the edge portion of each of the plurality of substrates can be inserted,
wherein the plurality of auxiliary grooves each have opposed groove forming faces; when the container main body opening portion is closed by at least the lid body, the edge portions of the plurality of substrates are respectively inserted into the auxiliary grooves; and the auxiliary grooves are disposed further outward in a circumferential direction of the edge portions of the plurality of substrates than the lid body side substrate support portion with respect to a central axis of the tubular wall portion, and
wherein the edge portions of the plurality of substrates are respectively inserted into the auxiliary grooves in a non-contact state in which a space is formed between each of the edge portions of the plurality of substrates and a corresponding groove forming face, and each of the edge portions of the plurality of substrates is not in contact with the corresponding groove forming face when the container main body opening portion is closed by the lid body.

2. The substrate storing container according to claim 1, wherein the lid body side substrate support portion and the substrate edge portion auxiliary portion that correspond to the same substrate are connected to each other.

3. The substrate storing container according to claim 1, wherein the groove forming faces are straight, flat planes, and an angle formed between a front side or a back side of each of the plurality of substrates and the corresponding groove forming face is 30 degrees or less.

4. The substrate storing container according to claim 1, further comprising side substrate support portions disposed to form a pair in the substrate storing space, wherein the side substrate support portions can support edge portions of the plurality of substrates in a state in which adjacent substrates among the plurality of substrates are arranged in parallel to be spaced apart from each other by a predetermined interval when the container main body opening portion is not closed by the lid body, and
wherein the auxiliary grooves each have a depth such that, when the container main body opening portion is not closed by the lid body and the edge portions of the plurality of substrates are supported by the side substrate support portions, the edge portions of the plurality of substrates are not inserted into the auxiliary grooves; and when the container main body opening portion is closed by the lid body, the edge portions of the substrates are inserted into the auxiliary grooves.

5. The substrate storing container according to claim 1, wherein the lid body side substrate support portion is elastically displaceable by a first displacement amount in a direction from the other end portion to the one end portion of the container main body when the container main body opening portion is closed by the lid body, and
wherein the substrate edge portion auxiliary portion is elastically displaceable by a second displacement amount smaller than the first displacement amount in the direction from the other end portion to the one end portion of the container main body when the container main body opening portion is closed by the lid body.

* * * * *